United States Patent
Zhu et al.

(10) Patent No.: US 8,654,823 B1
(45) Date of Patent: Feb. 18, 2014

(54) LOW LATENCY TRANSMITTER PATH DATA LINK INTERFACE

(75) Inventors: Xiang Zhu, San Jose, CA (US); Greg W. Starr, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 646 days.

(21) Appl. No.: 12/854,135

(22) Filed: Aug. 10, 2010

(51) Int. Cl.
*H04B 1/38* (2006.01)
*H04L 5/16* (2006.01)

(52) U.S. Cl.
USPC ............. 375/220; 375/219; 455/73; 710/1

(58) Field of Classification Search
None
See application file for complete search history.

(56) References Cited

U.S. PATENT DOCUMENTS

| | | | | |
|---|---|---|---|---|
| 6,941,433 B1* | 9/2005 | Libby et al. | | 711/167 |
| 7,073,145 B2* | 7/2006 | Fry et al. | | 716/114 |
| 7,180,345 B2* | 2/2007 | Atha et al. | | 327/172 |
| 2002/0043993 A1* | 4/2002 | Tam et al. | | 327/115 |
| 2008/0298476 A1* | 12/2008 | Bereza et al. | | 375/257 |
| 2009/0110130 A1* | 4/2009 | Boomer et al. | | 375/354 |

* cited by examiner

*Primary Examiner* — Shuwang Liu
*Assistant Examiner* — Gina McKie
(74) *Attorney, Agent, or Firm* — Kevin T. Cuenot

(57) ABSTRACT

A data link interface can include a programmable delay chain configured to provide an amount of delay to a first clock signal that clocks a first portion of a data path. The data link interface can include a phase interpolator configured to determine an amount of phase offset applied to a second clock signal that clocks a second portion of the data path. The data link interface further can include a latency detector coupled to the programmable delay chain and the phase interpolator. The latency detector can measure a phase difference between the first and second clock signals and vary the amount of delay applied to the first clock signal and/or the amount of phase offset on the second clock signal responsive to the phase difference.

18 Claims, 8 Drawing Sheets

400

| Early | Edge | Late | Q(0) | Q(n) |
|---|---|---|---|---|
| 0 | 0 | 0 | 0 | 0 |
| 0 | 0 | 1 | 0 | 0 |
| 0 | 1 | 0 | 0 | Q(n-1) |
| 0 | 1 | 1 | 0 | 1 |
| 1 | 0 | 0 | 0 | Q(n-1) |
| 1 | 0 | 1 | 0 | Q(n-1) |
| 1 | 1 | 0 | 0 | Q(n-1) |
| 1 | 1 | 1 | 0 | 1 |

LOW LATENCY TRANSMITTER PATH DATA LINK INTERFACE

FIELD OF THE INVENTION

One or more embodiments disclosed within this specification relate to integrated circuits (ICs). More particularly, one or more embodiments relate to a low latency transmitter path for a data link interface.

BACKGROUND

Within serialization/deserialization (SERDES) applications, parallel data is transferred between a Physical Coding Sublayer (PCS) circuit block and a Physical Medium Attachment Sublayer (PMA) circuit block. PCS and PMA circuit blocks are part of the sublayers that help define the physical (PHY) layer of various communication protocols. PCS and PMA circuit blocks exist within communication protocols including, but not limited to, Fast Ethernet, Gigabit Ethernet, and 10 Gigabit Ethernet.

For example, the Ethernet PHY layer includes a Data Link Layer (Layer 2) and PHY Layer (Layer 1). The Data Link Layer includes a Logical Link Control Sublayer, a Media Access Control Sublayer, and a Reconciliation Sublayer. The PHY layer includes the PCS, the PMA, and a Physical Medium Dependent Layer. The PCS circuit block can perform functions such as auto-negotiation and coding, e.g., 8b/10b type coding. The PMA circuit block can perform functions such as framing, octet synchronization/detection, scrambling, and descrambling.

While the PCS and PMA circuit blocks operate at or about the same frequency, each of the two circuit blocks is controlled by a different clock. Conventional SERDES applications utilize a first-in-first-out (FIFO) memory to cross the clock domain boundary between the two circuit blocks. The FIFO memory accommodates for any clock skew that may exist between the PCS clock and the PMA clock. Within high speed circuit applications, however, the FIFO memory typically introduces an unacceptable amount of delay into the data path.

SUMMARY

One or more embodiments disclosed within this specification relate to integrated circuits (ICs) and, more particularly, to a low latency transmitter path for a data link interface. One or more embodiments can include a data link interface. The data link interface can include a programmable delay chain configured to provide an amount of delay to a first clock signal, wherein the first clock signal clocks a first portion of a data path. The data link interface can include a phase interpolator configured to provide an amount of phase offset to a second clock signal. A frequency divider can be included that is coupled to an output of the phase interpolator and that receives the second clock signal. The frequency divider can be configured to generate a third clock signal being a frequency divided version of the second clock signal. The third clock signal can clock a second portion of the data path. The first portion and the second portion of the data path can be directly coupled. The data link interface also can include a latency detector coupled to the frequency divider and the programmable delay chain. The latency detector can be configured to measure a phase difference between the first and third clock signals and vary at least one of the amount of delay applied to the first clock signal or the amount of phase offset on the second clock signal responsive to the phase difference.

One or more other embodiments can include a method of data exchange between a first circuit block located in a first clock domain and a second circuit block located in a second clock domain. The method can include applying a variable amount of delay to a first clock signal clocking the first clock domain and applying a variable amount of phase offset to a second clock signal. The method can include frequency dividing the second clock signal to generate a third clock signal, wherein the third clock signal clocks the second clock domain. A phase difference between the first clock signal and the third clock signal can be measured. The method can include selectively adjusting the amount of delay applied to the first clock signal or the amount of phase offset on the second clock signal according to the measured phase difference.

One or more other embodiments can include an interface system. The interface system can include a programmable delay chain configured to provide an amount of delay to a first clock signal, wherein the first clock signal clocks a physical coding sublayer (PCS) of the interface system. The interface system also can include a phase interpolator configured to determine an amount of phase offset applied to a second clock signal, wherein the second clock signal clocks a physical medium attachment (PMA) circuit block of the interface system. The interface system further can include a latency detector coupled to the programmable delay chain and the phase interpolator. The latency detector can be configured to measure a phase difference between the first and second clock signals and vary at least one of the amount of delay applied to the first clock signal or the amount of phase offset on the second clock signal responsive to the phase difference. The output of the PCS circuit block can be directly coupled to an input of the PMA circuit block.

BRIEF DESCRIPTION OF THE DRAWINGS

FIG. 4 is a table illustrating delay adjustments in accordance with one or more other embodiments disclosed within this specification.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to a low latency transmitter path for a data link interface. In accordance with the one or more embodiments disclosed within this specification, a data link interface is disclosed that facilitates high speed data transfer between two different clock domains. The one or more embodiments facilitate high speed data transfer without the use of a first-in-first-out (FIFO) memory coupling the two clock domains together.

In one or more embodiments, the data link interface can be used to couple a Physical Coding Sublayer (PCS) circuit block with a Physical Medium Attachment Sublayer (PMA) circuit block. For example, the PCS circuit block and the PMA circuit block can be located within a serializer/deserializer (SERDES) module and can be directly coupled together. Typically the PCS circuit block and the PMA circuit block are clocked by two different clocks that operate at or about the same frequency. In consequence, synchronization between the two circuit blocks must be performed in order to ensure high speed data transfer from the PCS circuit block to the PMA circuit block while also achieving low latency in the data transfer.

Figure 1:
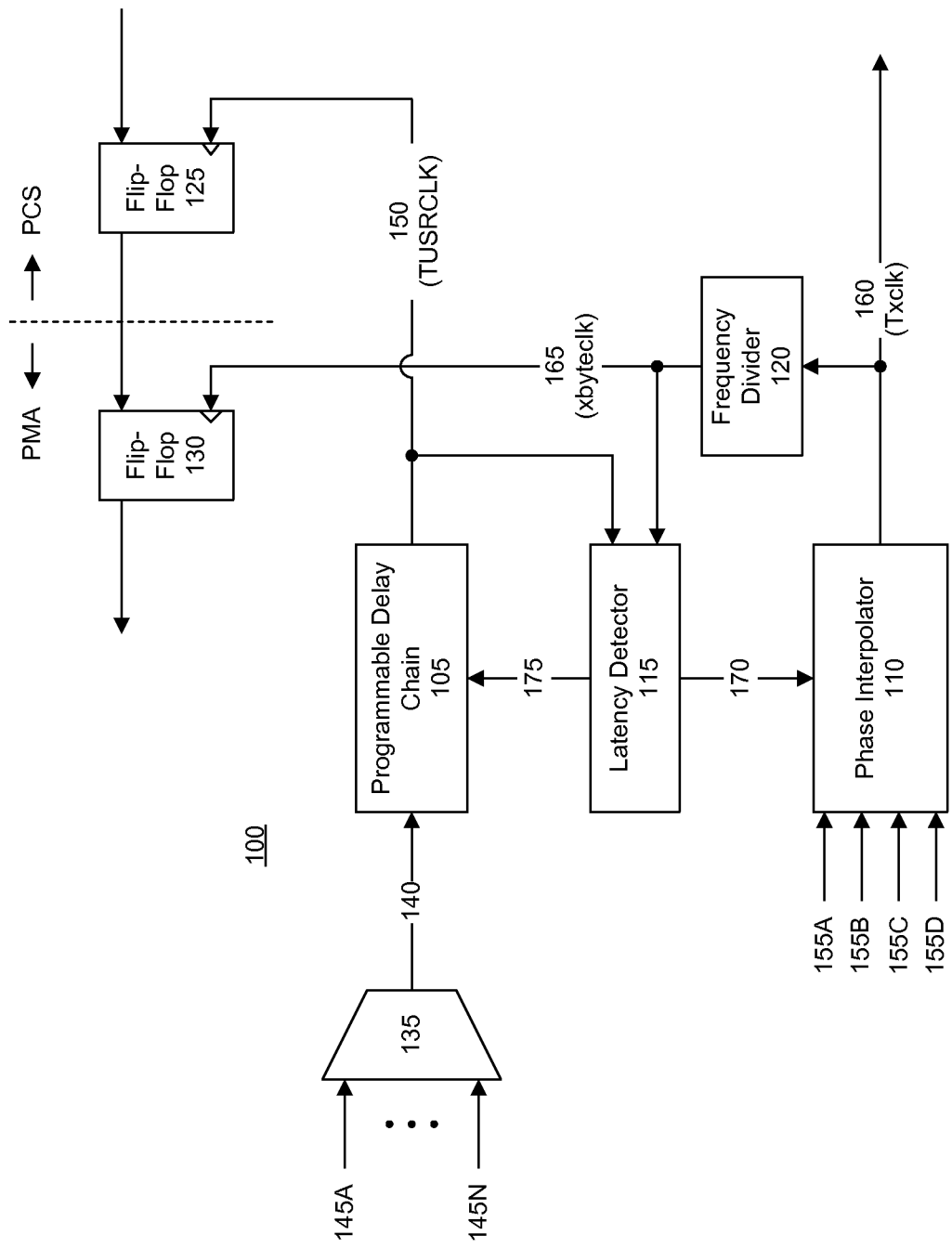
FIG. 1 is a first block diagram illustrating data link interface in accordance with one or more embodiments disclosed within this specification.

FIG. 1 is a first block diagram illustrating data link interface 100 in accordance with one or more embodiments disclosed within this specification. Data link interface 100 can be implemented within any of a variety of ICs. In one or more embodiments, data link interface 100 can be implemented within an IC that is not programmable, e.g., as a hard circuit. In one or more other embodiments, data link interface 100 can be implemented within a programmable IC. In that case, one or more or all of the circuit blocks can be implemented as soft circuit blocks formed using the programmable circuitry of the programmable IC. Alternatively, the circuit blocks can be implemented as hard circuit blocks or as a combination of hard circuit blocks and soft circuit blocks.

Programmable ICs are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

As shown, data link interface 100 can include a programmable delay chain 105. Programmable delay chain 105 can receive a reference clock signal 140 that is passed from a multiplexer 135. A plurality of different clock reference signals 145A-145N can be provided to multiplexer 135. In one or more embodiments, each of clock reference signals 145A-145N can have a different frequency. In one or more embodiments, clock reference signals 145A-145N can be phase aligned. One of clock reference signals 145A-145N can be selected and passed through multiplexer 135 as clock reference signal 140 according to a control or select signal (not shown) provided to multiplexer 135. Multiplexer 135 allows data link interface 100 to operate over a wide variety of different clock signals.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Programmable delay chain 105 can apply a variable and programmable, e.g., selectable, amount of delay to clock reference signal 140. In this regard, the delay applied to clock reference signal 140 can be varied during operation of data link interface 100. As shown, programmable delay chain 105 can output clock signal 150, also referred to as "TUSRCLK." Clock signal 150 can be a delayed or processed version of clock reference signal 140. It should be appreciated, however, that in some cases programmable delay chain 105 can apply zero delay to clock reference signal 140. In that case, clock signal 150 is delayed only by the amount of time necessary to propagate through programmable delay chain 105 with no other delay being applied. In any case, as shown, clock signal 150 can be provided to flip-flop (FF) 125 as a clock signal. Programmable delay chain 105 also can provide clock signal 150 to a latency detector 115.

Phase interpolator 110 can receive four clock reference signals 155A, 155B, 155C, and 155D. For example, clock reference signals 155A-155D can be generated by a phase locked loop or other circuit configured to generate a high frequency and stable clock signal. In one or more embodiments, clock reference signals 155A-155D can have a same frequency, but have different phases. In illustration, clock reference signal 155A can have a phase of approximately zero degrees and serve as a baseline signal from which the phase of each of signals 155B, 155C, and 155D is offset. Accordingly, clock reference signal 155B can have a phase that is approximately 90 degrees offset from clock reference signal 155A. Clock reference signal 155C can have a phase that is approximately 180 degrees offset from clock reference signal 155A. Clock reference signal 155D can have a phase that is approximately 270 degrees offset from clock reference signal 155A.

Phase interpolator 110 can be configured to output a phase adjusted clock signal 160, also referred to as "Txclk." Clock signal 160 can have a phase difference with respect to clock reference signal 155A that can range from approximately zero degrees to approximately 360 degrees. In one or more embodiments, phase interpolator 110 can adjust the phase of clock signal 160 in 128 discreet steps resulting in a minimal phase adjustment of approximately 360/128 degrees per adjustment. Thus, the phase of clock signal 160 can be dynamically phase adjusted in 128 increments during operation of data link interface 100.

Clock signal 160 can be output from phase interpolator 110 and also provided to frequency divider 120. Frequency divider 120 can generate frequency divided version of clock signal 160 referred to as clock signal 165. Clock signal 165 also can be referred to as "xbyteclk." As shown, clock signal 165 can be provided to FF 130 as a clock signal and also to latency detector 115. In one or more embodiments, frequency divider 120 can divide clock signal 160 by any of a variety of different divisor values such as two, four, or the like. The divisor value can be selected to match the frequency of clock signal 165 with the frequency of clock signal 150.

Latency detector 115 can be configured to measure the phase difference between clock signals 150 and 165. In general, as will be described within this specification in greater detail, latency detector 115 can determine the phase relationship between clock signals 150 and 165 and generate control signal 170 to phase interpolator 110 and control signal 175 to programmable delay chain 105. Accordingly, latency detector 115 controls the amount of delay applied by programmable delay chain 105 in generating clock signal 150 and the phase of clock signal 160 as generated by phase interpolator 110 via control signals 175 and 170 respectively responsive to the measured phase difference between clock signals 150 and 165.

In one or more embodiments, control signal 170 can be configured as a seven bit signal to facilitate control over the 128 discrete steps of phase adjustment that can be applied by phase interpolator 110. Thus, the particular phase of clock signal 160, as generated by phase interpolator 110, can be controlled and specified by latency detector 115. In one or more embodiments, control signal 175 can be configured as an eight bit signal that controls the amount of delay applied by programmable delay chain 105 in generating clock signal 150.

As pictured in FIG. 1, FF 125 can be considered part of a PCS circuit block, e.g., an output, while FF 130 can be considered part of a PMA circuit block, e.g., an input. In this regard, clock signal 150 can represent the clock signal for the PCS circuit block and clock signal 165 can represent the clock signal for the PMA circuit block. FFs 125 and 130, taken in combination, represent a data path between the PCS and PMA circuit blocks that crosses clock domain boundaries without the use of a FIFO memory. It should be appreciated that additional FFs clocked as show can be included to facilitate parallel data transfers of additional signals to achieve a multi-bit parallel interface. In any case, FFs 125 and 130 can be directly coupled by a wire conveying a data signal without any other intervening components.

In one or more embodiments, clock reference signals 155A-155D can have a frequency that is substantially higher than the frequency of clock reference signal 140. Thus, after processing by frequency divider 120, clock signal 165 has a frequency that is approximately or substantially the same as that of clock signal 140. Use of higher frequency clock reference signals 155A-155D allows smaller delay elements to be used within phase interpolator 110, thereby resulting in less IC area usage to implement phase interpolator 110 than would be the case were a lower frequency clock reference signal used. Accordingly, after a phase adjustment is applied at the higher frequency, frequency divider 120 can generate clock signal 165 having substantially the same phase as clock signal 160. For example, when frequency divider 120 uses two as the divisor, the phase adjustment occurring in clock signal 165 will be the same as that applied to clock signal 160 in terms of absolute time, but will be approximately one-half as large when considered in terms of the period of clock signal 165. This allows the combination of phase interpolator 110 and frequency divider 120 to provide increased control over phase while utilizing less IC area overall.

Figure 2:
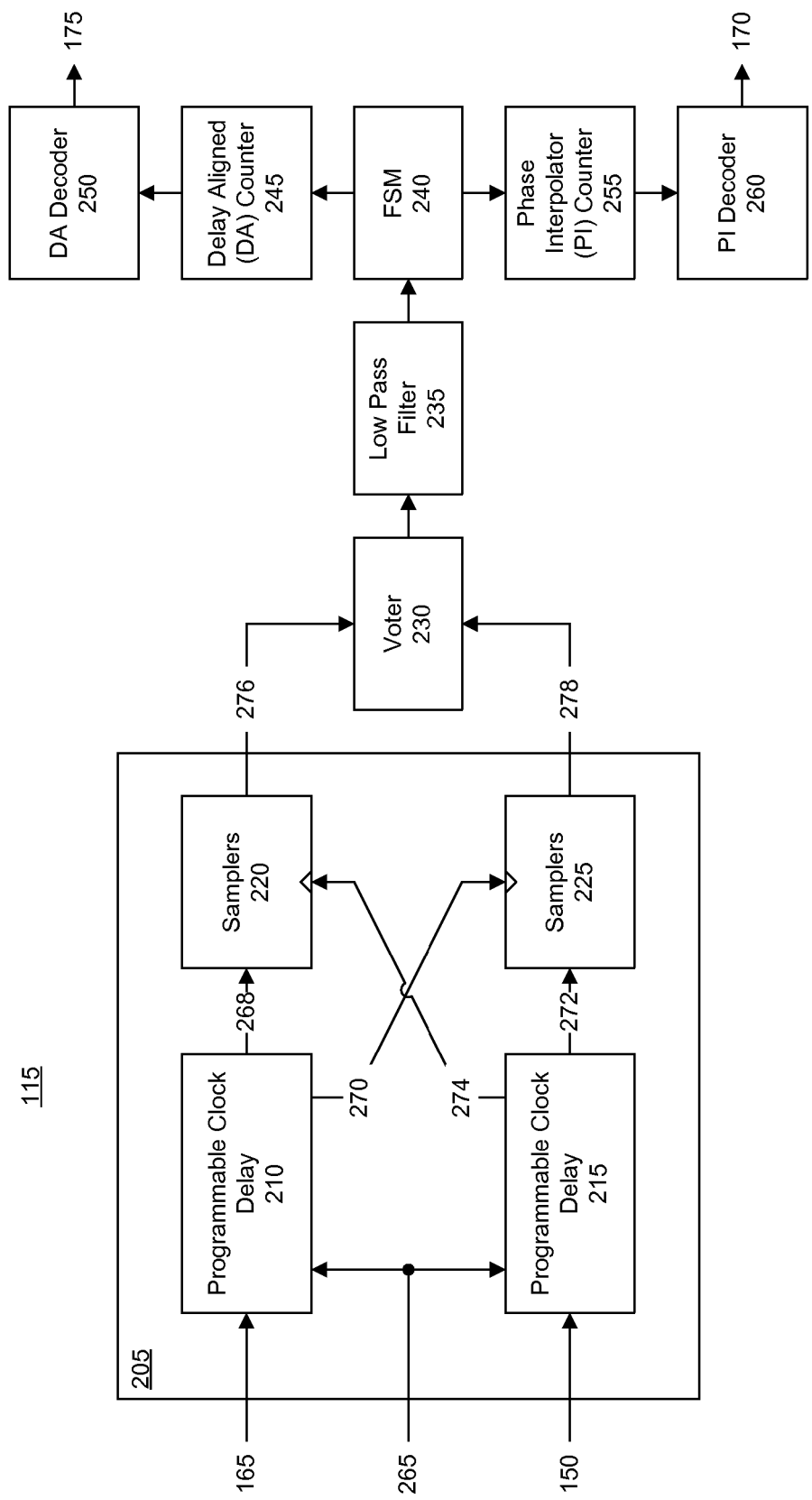
FIG. 2 is a second block diagram illustrating a latency detector in accordance with one or more other embodiments disclosed within this specification.

FIG. 2 is a second block diagram illustrating a latency detector in accordance with one or more other embodiments disclosed within this specification.

FIG. 2 illustrates an exemplary implementation of latency detector 115 described with reference to FIG. 1. To facilitate a better understanding of the one or more embodiments described, like numbers will be used to refer to the same items throughout this specification to the extent possible.

As shown, latency detector 115 can include a variety of circuit blocks such as delay and sample (DS) module 205. DS module 205 can include programmable clock delays 210 and 215 and samplers 220 and 225. Programmable clock delay 210 can receive clock signal 165 (xbyteclk) and programmable clock delay 215 can receive clock signal 150 (TUSRCLK). Each of programmable clock delays 210 and 215 can apply a variable amount of delay to clock signals 165 and 150 respectively responsive to control signal 265. Though illustrated as a single signal, it should be appreciated that programmable clock delay 210 and programmable clock delay 215 can be controlled independently of one another via control signal 265.

Programmable clock delay 210 can output a signal 268 to samplers 220 and a signal 270 to samplers 225. Signal 268 can be considered a data signal derived from clock signal 165. Signal 268 is sampled by samplers 220, whereas signal 270 clocks samplers 225. Similarly, programmable clock delay 215 can output a signal 272 to samplers 225 and a signal 274 to samplers 220. Signal 272 can be considered a data signal derived from clock signal 150. Signal 272 is sampled by samplers 225, whereas signal 274 is used to clock samplers 220.

In one or more embodiments, each of programmable clock delays 210 and 215 can account for delays such as setup, hold, as well as delays that vary or are induced within circuitry due to fluctuations in temperature. Accordingly, once initialized to a particular delay setting, each of programmable clock delays 210 and 220 can be adjusted, for example, to continually adjust for variations in component performance that arise due to temperature fluctuations. Programmable clock delays 210 and 220, however, are generally not used to vary clock signal 165 from clock signal 150 in consequence of an ongoing comparison as is the case with programmable delay chain 105 and phase interpolator 110 of FIG. 1, for example.

The results as illustrated by signals 276 and 278 output from each of samplers 220 and samplers 225 respectively can be provided to a voter circuit 230. In one or more embodiments, a multi-mode approach can be used in which either signal 276 or signal 278 is evaluated in a given mode. The mode can be switched so that voter circuit 230 evaluates signal 276 during one mode and signal 278 during another mode. When evaluating signal 276, for example, signal 268 (e.g., a version of clock signal 165) is sampled according to signal 274 (e.g., a version of clock signal 150). When evaluating signal 278, for example, signal 272 (e.g., a version of clock signal 150) is sampled according to signal 270 (e.g., a version of clock signal 165).

Voter circuit 230 generates an output signal that is provided to a low pass filter 235. Voter circuit reads values specified by signal 276 and/or signal 278, depending upon the current mode of operation, at appointed times, e.g., as clocked by a reference clock signal or signals. Low pass filter 235, for example, can be configured to pass every "nth" result from voter circuit 230, where "n" can be an integer value. For example, low pass filter 235 can be configured to pass every $10^{th}$ result from voter circuit 230.

Results from low pass filter 235 can be output to a finite state machine (FSM) 240. FSM 240 can be configured to generate an output to either delay aligned (DA) counter 245 or to phase interpolator (PI) counter 255 according to the particular mode in which latency detector 115 is in at any given time. For example, when in a mode that is adjusting clock signal 165 (xbyteclk mode), FSM 240 can be configured to leave DA counter 245 unchanged, e.g., locked. In the xbyteclk mode, FSM 240 can instruct PI counter 255 to increment, decrement, or remain unchanged responsive to results received from low pass filter 235. When in a mode that is adjusting clock signal 150 (TUSRCLK mode), FSM 240 can be configured leave PI counter 255 unchanged, e.g., locked. In the TUSRCLK mode, FSM 240 can instruct DA counter 245 to increment, decrement, or remain unchanged responsive to results received from low pass filter 235.

Results, e.g., a count, from DA counter 245 can be passed to DA decoder 250. DA decoder 250 can translate the received count from DA counter 245 into control signals 175 that control the amount of delay applied by programmable delay chain 105 in FIG. 1 to clock signal 140. Similarly, results, e.g., a count, from PI counter 255 can be output to PI decoder 260. PI decoder 260 can translate the received count from PI counter 260 into control signal 170 to control the amount of phase adjustment applied by phase interpolator 110 in generating clock signal 160 (Txclk), and therefore clock signal 165 (xbyteclk).

Figure 3:
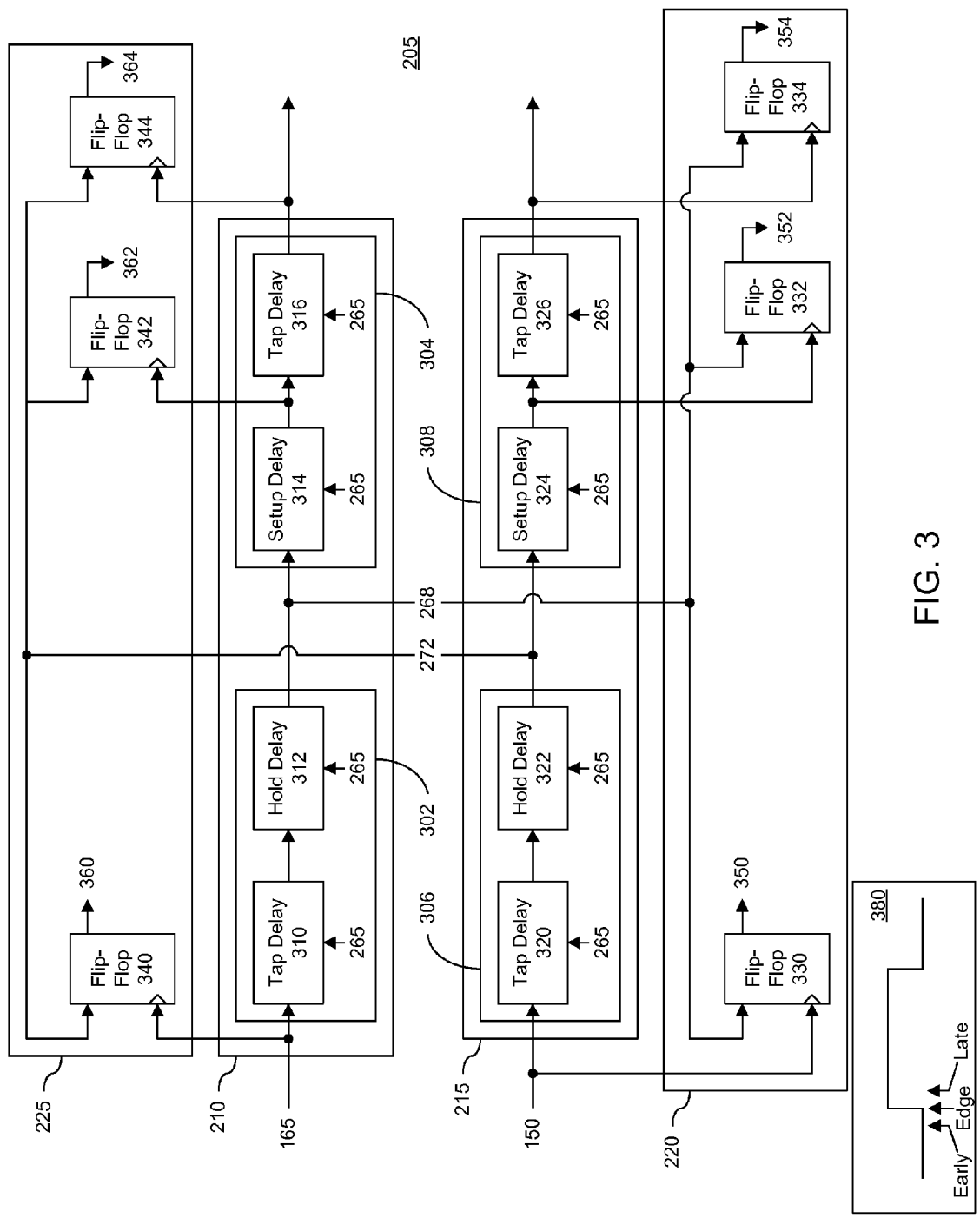
FIG. 3 is a third block diagram illustrating a delay and sampling circuit block in accordance with one or more other embodiments disclosed within this specification.

FIG. 3 is a third block diagram illustrating a delay and sampling circuit block in accordance with one or more other embodiments disclosed within this specification. More particularly, FIG. 3 illustrates a more detailed view of DS circuit block 205 of FIG. 2 in accordance with one or more embodiments. As shown, programmable clock delay 210 can include a hold delay module 302 and a setup delay module 304. Similarly, programmable clock delay 215 can include a hold delay module 306 and a setup delay module 308.

Hold delay module 302, in general, adjusts the amount of delay applied to signal 268 that is to be sampled by samplers 220. As shown, hold delay module 302 can include a tap delay 310 and a hold delay 312, each being controlled by respective control signals 265 to adjust the amount of delay applied by each of tap delay 310 and hold delay 312. Hold delay 312 can be adjusted to ensure that the data remains stable for a sufficient amount of time to be sampled by samplers 220. Tap delay 310 can be adjusted to account for variations in the amount of delay necessary for signal 268 to be sampled as temperature changes within the circuit, e.g., within data link interface 100.

Hold delay module 306, in general, adjusts the amount of delay applied to signal 272 that is to be sampled by samplers 225. As shown, hold delay module 306 can include a tap delay 320 and a hold delay 322, each being controlled by respective control signals 265 to adjust the amount of delay applied by each of tap delay 320 and hold delay 322. Hold delay 322 can be adjusted to ensure that the data remains stable for a sufficient amount of time to be sampled by sampler 225. Tap delay 320 can be adjusted to account for variations in the amount of delay necessary for signal 272 to be sampled as temperature changes within the circuit, e.g., within data link interface 100.

Samplers 220 can include a plurality of FFs 330-334. As shown, signal 268 can be output from hold delay module 302 and provided to samplers 220 as the signal to be sampled by each of FFs 330-334. Samplers 225 can include a plurality of FFs 340-344. Similarly, signal 272 can be output from hold delay module 306 and provided to samplers 225 as the signal to be sampled by each of FFs 340-344.

Setup delay module 304 can include a setup delay 314 and a tap delay 316, each being controlled by respective control signals 265 to adjust the amount of delay applied by each of setup delay 314 and tap delay 316. Setup delay 314 can be configured to provide a clock signal for FF 342. Tap delay 316 can provide a variable amount of delay to adjust for temperature changes within data link interface 100. As shown, tap delay 315 can provide a clock signal for FF 344. FF 340 can be clocked by clock signal 165.

Accordingly, FF 340 generates early signal 360, which indicates the state of signal 272 prior to transition. FF 342 generates edge signal 362, which indicates the state of signal 272 at or about the edge or transition of signal 272. FF 344 generates late signal 364, which indicates the state of signal 272 after transition. Early signal 360, edge signal 362 and late signal 364, taken collectively, form signal 278 that is provided to voter circuit 230 of FIG. 2. Legend 380 illustrates the sampled values specified by signal 272 as reflected by the early, edge, and late signals from FFs 340, 342, and 344.

Setup delay module 308 can include a setup delay 324 and a tap delay 326, each being controlled by respective control signals 265 to adjust the amount of delay applied by each of setup delay 324 and tap delay 326. Setup delay 324 can be configured to provide a clock signal for FF 332. Tap delay 326 can provide a variable amount of delay to adjust for temperature changes within data link interface 100. As shown, tap delay 325 can provide a clock signal for FF 334. FF 330 can be clocked by signal clock 150.

Accordingly, FF 330 generates early signal 350 which indicates the state of signal 268 early, e.g., prior to transition. FF 332 generates edge signal 352, which indicates the state of signal 268 at or about the edge or transition of signal 268. FF 334 generates late signal 354, which indicates the state of signal 268 after transition. Early signal 350, edge signal 352, and late signal 354, taken collectively, form signal 276 that is provided to voter circuit 230 of FIG. 2. Legend 380 illustrates sampled values from signal 268 as reflected by the early, edge, and late signals from FFs 330, 332, and 334.

FIG. 4 is a table 400 illustrating delay adjustments in accordance with one or more other embodiments disclosed within this specification. Table 400 illustrates the instructions that are provided to DA counter 245 and/or PI counter 255 by FSM 240 of FIG. 2 based upon the various signals provided from low pass filter 235. Table 400 illustrates the various combinations of sampled values for the early, edge, and late signals that are evaluated.

For example, when in the xbyteclk mode, the phase applied to clock signal 160 can be varied according to the count value in PI counter 255. The count value in PI counter 255 can be incremented, decremented, or remain unchanged by FSM 240 according to the values of the early, edge, and late signals as specified in table 400. While adjusting phase interpolator 110, the delay applied by programmable delay chain 105 can remain fixed. In xbyteclk mode, for example, the circuit loop including phase interpolator 110 (referred to as the PI loop). Similarly, when in the TUSRCLK mode, the delay applied to clock signal 150 can be varied according to the count value in DA counter 245. The count value in DA counter 245 can be incremented, decremented, or remain unchanged by FSM 240 according to the values of the early, edge, and late signals as specified by table 400. In TUSRCLK mode, for example, the circuit loop including programmable delay chain 105 (referred to as the DA loop), can be said to be closed.

The column labeled "Q(0)" indicates the initial state upon reset or power on of data link interface 100. The column labeled "Q(n)" indicates for a given set of early, edge, and late signal values "n," where "n" again represents an integer value, the particular action to be taken in terms of incrementing, decrementing, or leaving a count unchanged. Within table 400 in columns Q(0) and Q(n), zero values indicate that the count of the relevant counter is to be decremented. One value within columns Q(0) and Q(n) indicate that the count of the relevant counter is to be incremented. A value of Q(n−1) in columns Q(0) and Q(n) indicates that the counter value is to be left unchanged.

Figure 5:
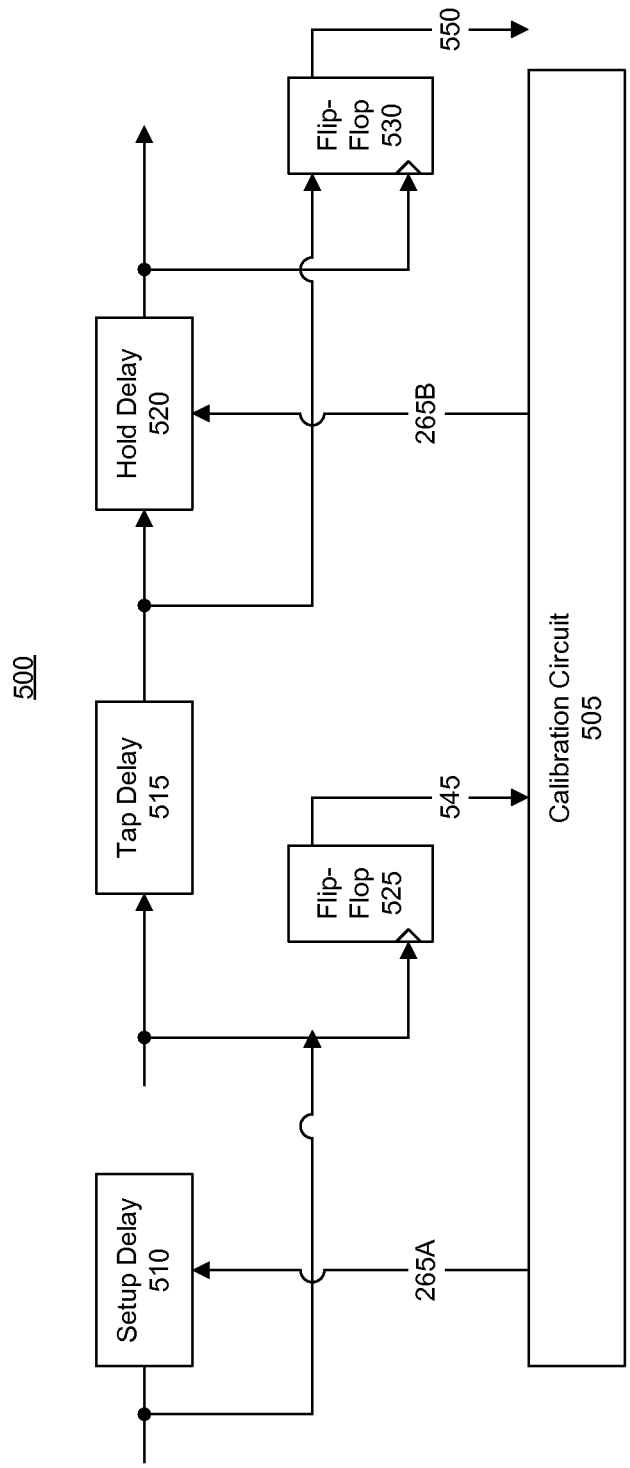
FIG. 5 is a fourth block diagram illustrating a calibration system in accordance with one or more other embodiments disclosed within this specification.

FIG. 5 is a fourth block diagram illustrating a calibration system 500 in accordance with one or more other embodiments disclosed within this specification. System 500 illustrates an exemplary implementation for a calibration circuit 505 that can be used to set initial values to be used for the setup delays and the hold delays described within this specification. In one or more embodiments, system 500 can be included within data link interface 100 or on the same IC within which data link interface 100 is implemented.

System 500 can include calibration circuit 505 configured to provide control signals 265A and 265B to setup delay 510 and hold delay 520 respectively. Setup delay 510, tap delay 515, and hold delay 520 each can be implemented substantially as described with reference to FIG. 3. Accordingly, the calibration process described within this specification can be applied to setup delays, tap delays, and hold delays incorporated within data link interface 100.

As shown, FF 525 samples the signal provided to setup delay 510 as input. FF 525 is clocked by the output of setup delay 510. Similarly, FF 530 samples the signal provided to hold delay 520 as input, e.g., the output of tap delay 515. FF 530 is clocked by the output of hold delay 520. Calibration circuit 505 can receive the output, e.g., sampled values, from each of FFs 525 and 530 in the form of signals 545 and 550 respectively. Calibration circuit 505 can adjust the amount of delay applied by each of setup delay 510 and hold delay 520 independently via control signals 265A and 265B respectively.

In one or more embodiments, each of control signals 265A and 265B can be implemented as a two or three bit signal specifying a code. The amount of delay applied by setup delay 510 can be controlled according to the value of the code specified by control signal 265A. The amount of delay applied by hold delay 520 can be controlled according to the code specified by control signal 265B.

For example, when control signal 265B specifies a "11" value, the amount of delay applied by hold delay 520 can be set to a maximum setting. For instance, hold delay 520 can be configured to apply approximately 200 picoseconds of delay. When control signal 265B specifies a "00" value, the amount of delay applied by hold delay 520 can be set to a minimum setting. For instance, hold delay 520 can be configured to apply approximately 100 picoseconds of delay. When the value specified by control signal 265B is either "10" or "01," the delay applied by hold delay 520 can be set to a mid-point. For instance, hold delay 520 can be configured to apply approximately 150 picoseconds of delay. Setup delay 510 can be configured in substantially the same way to provide substantially the same amount of delay albeit responsive to control signal 265A. It should be appreciated that the granularity in adjustment of setup delay 510 and/or hold delay 520 can depend upon the number of bits used to specify the codes sent via control signals 265A and 265B respectively.

In one or more embodiments, calibration circuit 505 can include registers to hold a current and a previous version of the two bit codes for each of setup delay 510 and hold delay 520. The delay applied can be varied according to the value sampled by each FFs 525 and 530 as well as the previous and current state of the control signals 265A and 265B, e.g., the current and previous codes.

Figure 6:
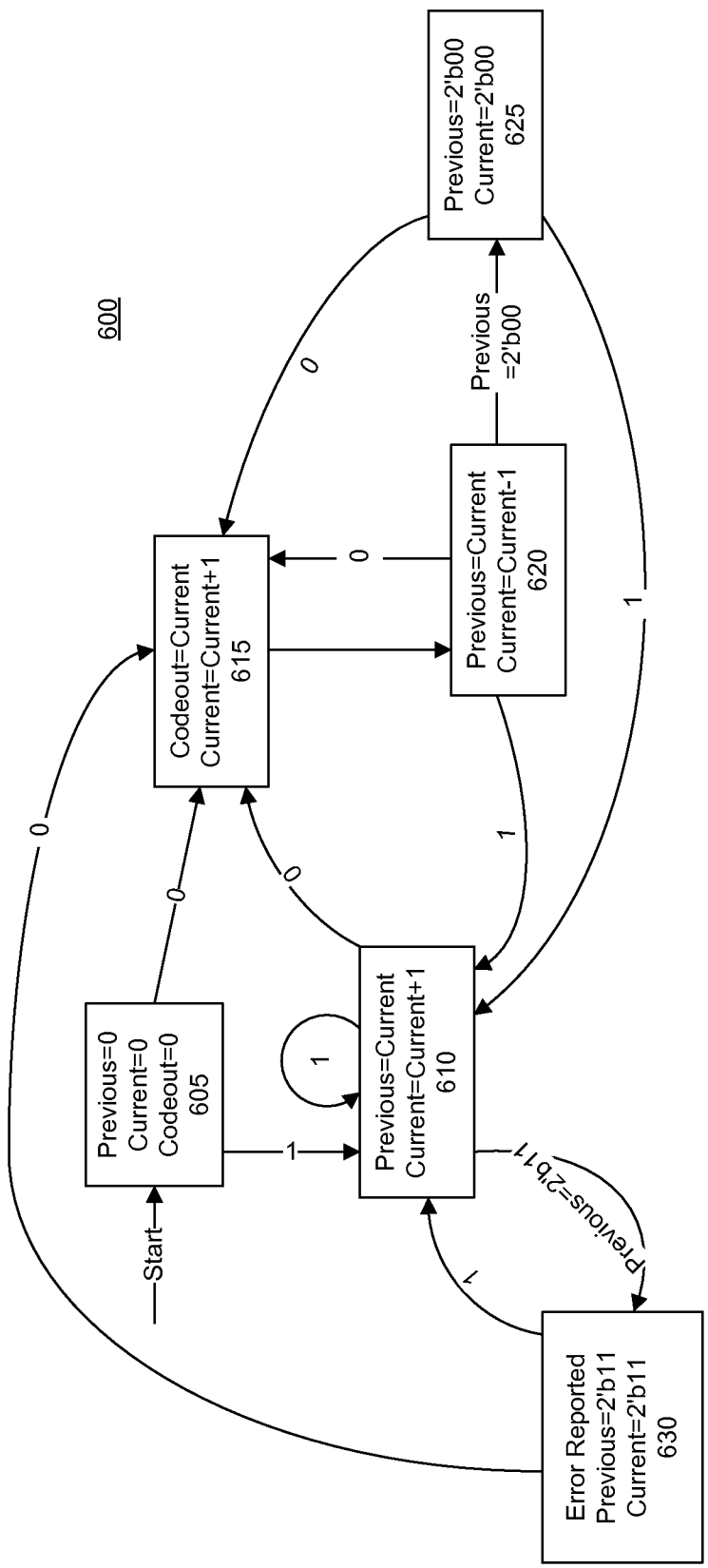
FIG. 6 is a first state diagram illustrating a method of calibrating a delay circuit in accordance with one or more other embodiments disclosed within this specification.

FIG. 6 is a first state diagram illustrating a method 600 of calibrating a delay circuit in accordance with one or more other embodiments disclosed within this specification. Method 600 illustrates an example of a methodology that can be implemented by calibration circuit 505 of FIG. 5 when calibrating hold delays of the data link interface. Accordingly, method 600 utilizes the current and previous codes specified by control signal 265B and the sampled value specified by signal 550 from FIG. 5.

Method 600 can begin in step 605, where the current and previous code values are initialized to zero. The term "codeout" refers to the code that is output on control signal 265B. Codeout also can be initialized to zero. In one or more embodiments, the calibration circuit can be configured to evaluate every "nth" sample received. For purposes of illustration, for example, the calibration controller can evaluate every eighth sample from the hold delay that is being calibrated (e.g., the output from FF 530 of FIG. 5). Accordingly, when a one is the sampled value, method 600 can proceed from step 605 to step 610. When a zero is sampled, method 600 can proceed from step 605 to step 615.

In step 610, the previous code can be set equal to the current code. The current code can be incremented by one. Codeout can remain unchanged. The particular delay applied based upon codeout can be implemented, for example, as described with reference to FIG. 5. When in step 610 and a one is sampled, method 600 can loop back to step 610. When in step 610 and a zero is sampled, method 600 can proceed from step 610 to step 615. When the previous code is, however, "11," method 600 can continue to step 630 regardless of the sampled value.

In step 615, codeout can be set equal to the current code. The current code can be incremented by one. After step 615, regardless of whether a one or a zero is sampled, method 600 can continue to step 620.

In step 620, the previous code can be set equal to the current code. The current code can be decremented by one. Codeout can remain unchanged. When in step 620 and a one is the sampled value, method 600 can proceed to step 610. When in step 620 and a zero is the sampled value, method 600 can proceed to step 615. When in step 620, however, and the previous value is "00," method 600 can proceed to step 625 regardless of the sampled value.

In step 625, the previous code can be set to "00" and the current code can be set to "00." Codeout can remain unchanged. When in step 625 and a zero is the sampled value, method 600 can proceed to step 615. When in step 625 and a one is the sampled value, method 600 can proceed to step 610.

In step 630, an error can be reported. The previous code can be set to "11" and the current code can be set to "11." Codeout can remain unchanged. When in step 630 and a zero is the sampled value, method 600 can proceed to step 615. When in step 630 and a one is the sampled value, method 600 can proceed to step 610.

Figure 7:
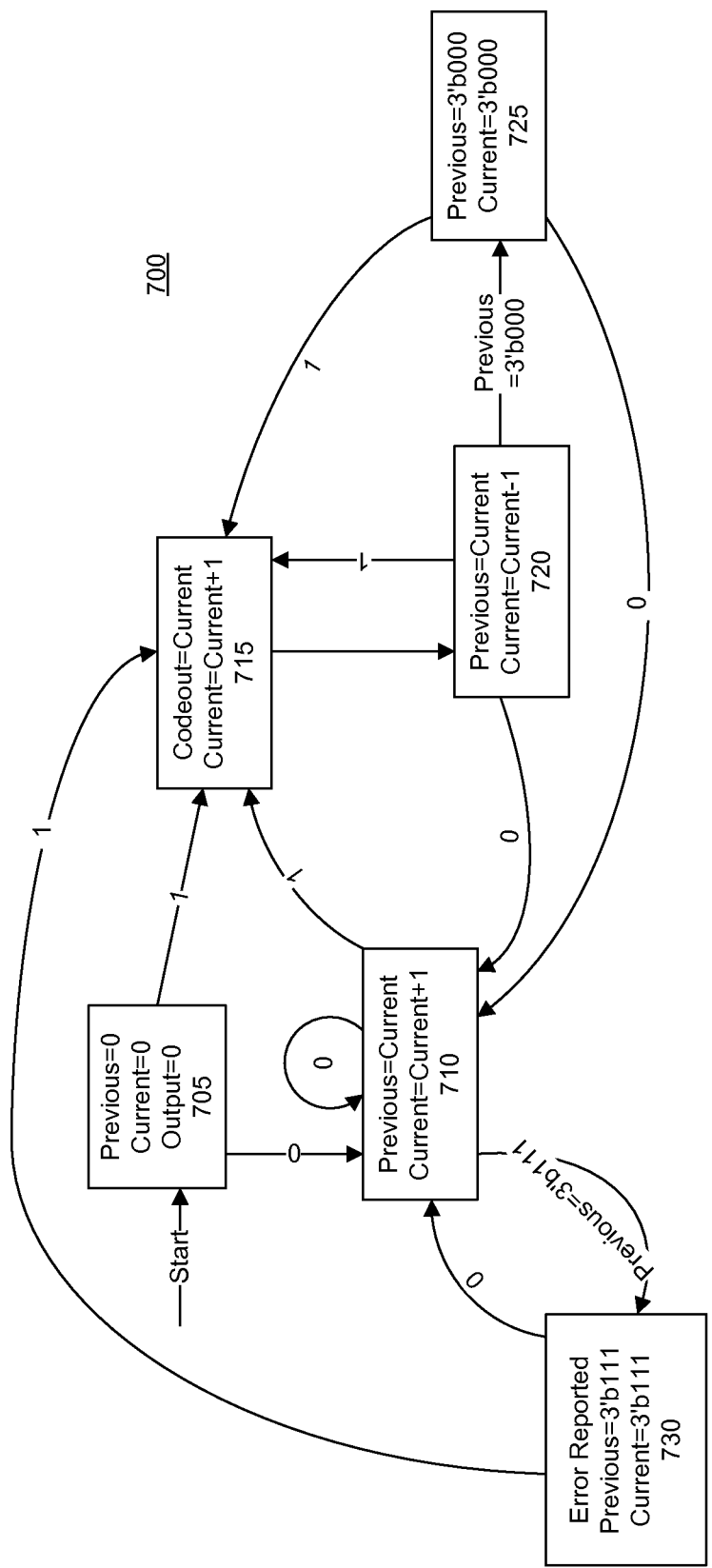
FIG. 7 is a second state diagram illustrating a method of calibrating a delay circuit in accordance with one or more other embodiments disclosed within this specification.

FIG. 7 is a second state diagram illustrating a method 700 of calibrating a delay circuit in accordance with one or more other embodiments disclosed within this specification. Method 700 illustrates an example of a methodology that can be implemented by calibration circuit 505 of FIG. 5 when calibrating setup delays of the data link interface. Accordingly, method 700 utilizes the current and previous codes specified by control signal 265A and the sampled value specified by signal 545 from FIG. 5.

Method 700 can begin in step 705, where the current and previous code values are initialized to zero. The term "codeout" refers to the code that is output on control signal 265A. Codeout also can be initialized to zero. In one or more embodiments, the calibration circuit can be configured to evaluate every "nth" sample received. For purposes of illustration, for example, the calibration controller can evaluate every eighth sample from the setup delay that is being calibrated (e.g., the output from FF 525 of FIG. 5). Accordingly, when a zero is the sampled value, method 700 can proceed from step 705 to step 710. When a one is sampled, method 700 can proceed from step 705 to step 715.

In step 710, the previous code can be set equal to the current code. The current code can be incremented by one. Codeout can remain unchanged. The particular delay applied based upon codeout can be implemented, for example, as described with reference to FIG. 5. In one or more embodiments, however, control signal 265A can be implemented using three bits, thereby allowing greater variability in the delay setting that can be applied.

When in step 710 and a zero is sampled, method 700 can loop back to step 710. When in step 710 and a one is sampled, method 700 can proceed from step 710 to step 715. When the previous code is, however, "111," method 700 can continue to step 730 regardless of the sampled value.

In step 715, codeout can be set equal to the current code. The current code can be incremented by one. After step 715, regardless of whether a one or a zero is sampled, method 700 can continue to step 720.

In step 720, the previous code can be set equal to the current code. The current code can be decremented by one. Codeout can remain unchanged. When in step 720 and a zero is the sampled value, method 700 can proceed to step 710. When in step 720 and a one is the sampled value, method 700 can proceed to step 715. When in step 720, however, and the previous value is "000," method 700 can proceed to step 725 regardless of the sampled value.

In step 725, the previous code is set to "000" and the current code can be set to "000." When in step 725 and a one is the sampled value, method 700 can proceed to step 715. When in step 725 and a zero is the sampled value, method 700 can proceed to step 710.

In step 730, an error can be reported. The previous code can be set to "111" and the current code can be set to "111." When in step 730 and a one is the sampled value, method 700 can proceed to step 715. When in step 730 and a zero is the sampled value, method 700 can proceed to step 710.

Figure 8:
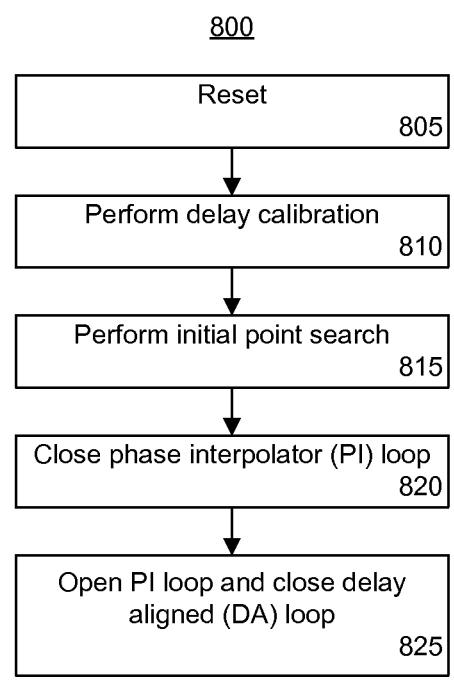
FIG. 8 is a flow chart illustrating a method of operation of a data link interface in accordance with one or more other embodiments disclosed within this specification.

FIG. 8 is a flow chart illustrating a method 800 of operation of a data link interface in accordance with one or more other embodiments disclosed within this specification. FIG. 8, for example, illustrates an exemplary method of operation for a data link interface as described within this specification with reference to FIGS. 1-7. Accordingly, method 800 can begin in step 805 where the data link interface can be reset. For example, the various delays described can be initialized to beginning values. The phase interpolator can be initialized to a beginning value.

In step 810, delay calibration can be performed. For example, the delay calibration procedures described with reference to FIGS. 6 and 7 can be performed. In one or more embodiments, the delay calibration process can continue to operate to ensure that the delays remain calibrated during operation the data link interface.

In step 815, an initial point search can be performed. Initial point search establishes an initial phase offset to be applied by phase interpolator 110. In one or more embodiments, the PI loop can be used to determine an initial start point from which the data link interface can begin operating. For example, clock signal 150 can be kept constant with programmable delay chain 105 applying a fixed amount of delay, or no delay to clock reference signal 140 of FIG. 1. Within step 815, the PI counter 255 can begin at effectively a zero count and begin incrementing. When voter circuit 230 detects a "011" on the early, edge, and late signals respectively, method 800 can proceed to step 820.

The initial point search described by step 815 illustrates a situation in which the amount of phase applied by phase interpolator 110 is continually adjusted, e.g., incremented, according to PI counter 255. PI counter 255 is incremented from the initial zero count until a "011" is detected by voter circuit 230. Under normal operating conditions, the count in PI counter 255 is adjusted based upon the results determined from voter circuit 230. Initial point search, however, determines the phase applied by phase interpolator 110 as the amount of phase adjustment that results in a "011" value being specified by the early, edge, and late signals as determined by voter circuit 230. The count in PI counter 255 is continually incremented by one until "011" is detected by voter circuit 230. The voter circuit 230, other than indicating when initial point search has completed by detection of "011," has no other influence upon the count in PI counter 255 during initial point search as is otherwise the case during normal operation after initial point search concludes as described with reference to table 400 of FIG. 4.

In step 820, the PI loop can be closed. Closure of the PI loop allows control signal 165 (xbyteclk) to be adjusted with respect to clock signal 150 (TUSRCLK), which can remain constant. Closure of the PI loop also means that the count in PI counter 255 is influenced by the result determined in voter circuit 230. In this regard, the DA loop can be said to be open. In step 820, programmable delay chain 105 does not vary the delay applied to clock signal 140 of FIG. 1. For example, when the PI loop is closed, the data link interface enters the mode in which the xbyteclk is adjusted. Accordingly, FSM 240 described with reference to FIG. 2 adjusts PI counter 255 responsive to output from voter circuit 230 and low pass filter 235 as described with reference to table 400 of FIG. 4.

In step 825, the PI loop can be open and the DA loop can be closed. In one or more embodiments, step 825 can be performed responsive to detecting that the rising edge of clock signal 150 and the rising edge of clock signal 165 are aligned for at least two consecutive rising clock edges. In one or more other embodiments, for example, values "001" can be evaluated as a "+1," whereas "011" can be evaluated as a "−1." An average can be calculated over a selected number of sample values, e.g., collections of early, edge, and late signals. When the average is less than a selected number such as two, four, or eight, depending upon the desired resolution of the system, the clock signals can be considered to be aligned, at least initially, and step 825 can be implemented.

Opening the PI loop effectively indicates that the xbyteclk mode has been exited as the clock signals have been initially aligned. Closing the DA loop can mean that the TUSRCLK mode has been entered. Accordingly, once operating in the TUSRCLK mode, FSM 240 can adjust DA counter 245 responsive to output from voter circuit 230 and low pass filter 235. PI counter 255 remains locked, as is phase interpolator 110, when xbyteclk mode is exited. Continued adjustment of programmable delay chain 105 through the closing of the DA loop and the closing of the PI loop allows data link interface 100 to continue adjusting clock signal 150 in relation to clock signal 165 in a dynamic manner while data link interface 100 continues to operate.

The flowcharts in the figures illustrate the architecture, functionality, and operation of possible implementations of systems, methods and computer program products according to one or more embodiments disclosed within this specification. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more other embodiments can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to instantiate or implement circuitry within an IC that is configured to perform at least a portion of the functions described within this specification. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A data link interface comprising:
   a programmable delay chain configured to provide an amount of delay to a first clock signal, wherein the first clock signal clocks a first portion of a data path;
   a phase interpolator configured to provide an amount of phase offset to a second clock signal;
   a frequency divider coupled to an output of the phase interpolator and receiving the second clock signal, wherein the frequency divider is configured to generate a third clock signal being a frequency divided version of the second clock signal, and wherein the third clock signal clocks a second portion of the data path, wherein the first portion and the second portion of the data path are directly coupled;
   a latency detector coupled to the frequency divider and the programmable delay chain, wherein the latency detector is configured to measure a phase difference between the first and third clock signals and vary at least one of the amount of delay applied to the first clock signal or the amount of phase offset on the second clock signal responsive to the phase difference; and
   wherein the latency detector further comprises a delay and sample module configured to sample a first data signal derived from the first clock signal while being clocked according to the third clock signal and to sample a second data signal derived from the third clock signal while being clocked according to the first clock signal.

2. The data link interface of claim 1, wherein the delay and sample module is configured to generate an early sample of the first data signal, an edge sample of the first data signal, and a late sample of the first data signal when operating in a first mode.

3. The data link interface of claim 2, wherein the latency detector further comprises a finite state machine circuit coupled to the delay and sample module, wherein the finite state machine circuit is configured to adjust the amount of delay applied to the first clock signal according to the early sample of the first data signal, the edge sample of the first data signal, and the late sample of the first data signal when operating in the first mode.

4. The data link interface of claim 3, wherein the delay and sample module is configured to generate an early sample of the second data signal, an edge sample of the second data signal, and a late sample of the second data signal when operating in a second mode.

5. The data link interface of claim 4, wherein the latency detector further comprises a finite state machine circuit coupled to the delay and sample module, wherein the finite state machine circuit is configured to adjust the amount of phase offset applied to the second clock signal according to the early sample of the second data signal, the edge sample of the second data signal, and the late sample of the second data signal when operating in the second mode.

6. The data link interface of claim 5, wherein the finite state machine circuit is configured to switch between the first mode and the second mode.

7. The data link interface of claim 1, wherein the delay and sample module comprises:
a first programmable clock delay configured to receive the third clock signal, wherein the first programmable clock delay is configured to generate a first delayed version of the third clock signal and a second delayed version of the third clock signal; and
a second programmable clock delay configured to receive the first clock signal, wherein the second programmable clock delay is configured to generate a first delayed version of the first clock signal and a second delayed version of the first clock signal.

8. The data link interface of claim 7, wherein the delay and sample module comprises:
a first sampler clocked by the third clock signal, the first delayed version of the third clock signal, and the second delayed version of the third clock signal; and
a second sampler clocked by the first clock signal, the first delayed version of the first clock signal, and the second delayed version of the first clock signal.

9. The data link interface of claim 8, wherein the first programmable clock delay comprises a first hold delay module configured to generate the second data signal by delaying the third clock signal.

10. The data link interface of claim 9, wherein the second programmable clock delay comprises a second hold delay module configured to generate the first data signal by delaying the first clock signal.

11. The data link interface of claim 10, wherein the first programmable clock delay further comprises: a first setup module configured to generate the first delayed version of the third clock signal and the second delayed version of the third clock signal.

12. The data link interface of claim 11, wherein the second programmable clock delay further comprises: a second setup module configured to generate the first delayed version of the first clock signal and the second delayed version of the first clock signal.

13. The data link interface of claim 1, wherein the first portion of the data path is a physical coding sublayer of the data link interface and the second portion of the data path is a physical medium attachment circuit block of the data link interface.

14. A method of data exchange between a first circuit block located in a first clock domain and a second circuit block located in a second clock domain, the method comprising:
applying a variable amount of delay to a first clock signal clocking the first clock domain;
applying a variable amount of phase offset to a second clock signal;
frequency dividing the second clock signal to generate a third clock signal, wherein the third clock signal clocks the second clock domain;
measuring a phase difference between the first clock signal and the third clock signal;
selectively adjusting the amount of delay applied to the first clock signal or the amount of phase offset on the second clock signal according to the measured phase difference; and
sampling a first data signal derived from the first clock signal while being clocked according to the third clock signal and sampling a second data signal derived from the third clock signal while being clocked according to the first clock signal.

15. The method of claim 14, further comprising:
adjusting the amount of phase offset in the second signal while operating in a first mode.

16. The method of claim 15, further comprising:
adjusting the amount of delay applied to the first clock signal when operating in a second mode.

17. The method of claim 16, further comprising:
switching from the first mode to the second mode responsive to determining that a selected edge type of the first and second clock signals is aligned.

18. A data link interface comprising:
a programmable delay chain configured to provide an amount of delay to a first clock signal, wherein the first clock signal clocks a physical coding sublayer of the data link interface;
a phase interpolator configured to determine an amount of phase offset applied to a second clock signal, wherein the second clock signal clocks a physical medium attachment circuit block of the data link interface;
a latency detector coupled to the programmable delay chain and the phase interpolator, wherein the latency detector is configured to measure a phase difference between the first and second clock signals and vary at least one of the amount of delay applied to the first clock signal or the amount of phase offset on the second clock signal responsive to the phase difference,
wherein an output of the physical coding sublayer circuit block is directly coupled to an input of the physical medium attachment circuit block; and
wherein the latency detector is configured to adjust at least one of the amount of delay or the amount of phase offset according to a combination of three samples of the first clock signal or the second clock signal taken at varying times, wherein the three samples collectively indicate whether to increment, decrement, or leave unchanged the amount of delay or the amount of phase offset.

* * * * *